United States Patent
Koehler

(10) Patent No.: US 8,975,931 B2
(45) Date of Patent: Mar. 10, 2015

(54) CIRCUIT CONFIGURATION AND METHOD FOR LIMITING CURRENT INTENSITY AND/OR EDGE SLOPE OF ELECTRICAL SIGNALS

(75) Inventor: Ingo Koehler, Ludwigsburg (DE)

(73) Assignee: Robert Bosch GmbH, Stuttgart (DE)

( * ) Notice: Subject to any disclaimer, the term of this patent is extended or adjusted under 35 U.S.C. 154(b) by 23 days.

(21) Appl. No.: 13/812,732

(22) PCT Filed: Jun. 3, 2011

(86) PCT No.: PCT/EP2011/059186
§ 371 (c)(1),
(2), (4) Date: Apr. 8, 2013

(87) PCT Pub. No.: WO2012/013402
PCT Pub. Date: Feb. 2, 2012

(65) Prior Publication Data
US 2013/0187695 A1    Jul. 25, 2013

(30) Foreign Application Priority Data
Jul. 29, 2010    (DE) .......................... 10 2010 038 623

(51) Int. Cl.
*H03K 5/12*    (2006.01)
*H03K 5/04*    (2006.01)
*H03K 17/082*    (2006.01)
*H03K 17/16*    (2006.01)

(52) U.S. Cl.
CPC .............. *H03K 5/04* (2013.01); *H03K 17/0828* (2013.01); *H03K 17/166* (2013.01)
USPC ............................ 327/170; 327/309; 327/432

(58) Field of Classification Search
USPC ................................................. 327/309, 170
See application file for complete search history.

(56) References Cited

U.S. PATENT DOCUMENTS

| | | | | |
|---|---|---|---|---|
| 4,581,542 A * | 4/1986 | Steigerwald | ................ | 327/440 |
| 4,695,770 A * | 9/1987 | Raets | ................ | 315/207 |
| 4,740,722 A * | 4/1988 | Furuhata | ................ | 327/432 |
| 4,866,313 A * | 9/1989 | Tabata et al. | ................ | 327/432 |
| 5,694,025 A * | 12/1997 | Oglesbee et al. | ................ | 320/137 |
| 7,023,246 B2 * | 4/2006 | Scollo et al. | ................ | 327/108 |
| 7,218,164 B2 * | 5/2007 | Vitale et al. | ................ | 327/376 |
| 7,649,401 B2 * | 1/2010 | Scollo et al. | ................ | 327/432 |
| 8,400,797 B2 * | 3/2013 | Chan et al. | ................ | 363/86 |
| 2008/0112194 A1 * | 5/2008 | Sarkela | ................ | 363/21.16 |
| 2009/0085656 A1 | 4/2009 | Havanur | | |
| 2011/0122668 A1 * | 5/2011 | Lo et al. | ................ | 363/126 |
| 2012/0086348 A1 * | 4/2012 | Tobler et al. | ................ | 315/186 |
| 2012/0133309 A1 * | 5/2012 | Sean et al. | ................ | 318/139 |

FOREIGN PATENT DOCUMENTS

DE    43 25 938    2/1994
DE    198 23 459    12/1998

OTHER PUBLICATIONS

International Search Report for PCT/EP2011/059186, dated Dec. 6, 2011.

* cited by examiner

*Primary Examiner* — Ryan Jager
(74) *Attorney, Agent, or Firm* — Kenyon & Kenyon LLP

(57) ABSTRACT

A circuit configuration for the limiting of current intensity and/or the edge slope of electrical signals includes: a voltage source; a switching element connected to the voltage source and equipped for switching the voltage source; and a limiting unit functionally positioned between the switching element and the voltage source, the limiting unit being equipped to limit a current intensity and/or an edge slope of an electrical signal in response to a switching process of the voltage source while using the switching element.

16 Claims, 3 Drawing Sheets

CIRCUIT CONFIGURATION AND METHOD FOR LIMITING CURRENT INTENSITY AND/OR EDGE SLOPE OF ELECTRICAL SIGNALS

BACKGROUND OF THE INVENTION

1. Field of the Invention

The present invention relates to a circuit configuration and a method for limiting the current intensity and/or the edge slope of electrical signals.

2. Description of the Related Art

Electrical switching elements, such as drive components, usually have a fixed, unchangeable edge slope, which may not be adapted to a desired application case in optimum fashion. For example, when standard components are used or standard assemblies, it may not always be possible to influence an internal drive current of the respective standard element. Even a specified short circuit limitation, to the extent that a switching element used has one, may not always be adapted optimally to a special, desired application case.

Too high an edge slope of a switching process or clock-pulsed signals may, among other things, exceed EMC emission boundary values (electromagnetic compatibility) and thus injure it.

Furthermore, too high a current limitation set or even a missing current limitation in a fault case, for instance, in a short circuit state, may bring about an overload of a component or an assembly, and potentially damage it thereby.

BRIEF SUMMARY OF THE INVENTION

Accordingly, a circuit configuration is provided for the limiting of current intensity and/or edge slope of electrical signals, having a voltage source and a switching element that is connected to the voltage source, and which is equipped for switching the voltage source, wherein the switching device further has a limiting unit, the limiting unit being functionally positioned between the switching element and the voltage source, and the limiting unit being equipped to limit the current intensity and/or an edge slope of an electrical signal in response to a switching process of the voltage source while using the switching element.

The circuit configuration according to the present invention may, on the one hand, provide a current limitation, and on the other hand, an edge limitation. The circuit configuration may particularly be implemented using few standard components, and may thus be implemented cost-effectively and having low space requirement, for instance, on a printed-circuit board. Known driver circuits may be broadened, especially without major systems interventions, by a circuit configuration for limiting the current intensity and/or the edge slope according to the present invention. This may be implemented particularly in that the internal drive signals of a driver circuit do not have to be influenced.

The limitation of short circuit current and an edge slope for a desired application case may be adjustable by the selection of suitable component values of the circuit configuration, easily parameterizable to the desired application case. A readily developed standard layout of an electronic circuit may be adaptable to a certain application case by the simple reassembling of the respective component values to the desired requirements. Thus, a desired short circuit current and a required edge slope, and consequently an EMC boundary value, is able to be set simply and flexibly by the selection of the component values.

By such a flexibility, for instance, in an EMC optimization to be carried out, an edge slope that is occurring may very rapidly and simply be adapted to a required edge slope. In particular, it may thus not be necessary extensively to redesign an already existing or developed switching component, in order to correspond to a changed EMC emission boundary value for a new application. Consequently, a lengthy, cost-encumbered and risk-encumbered reworking of a switching assembly may be omitted.

The circuit configuration may, however, also be able to be used itself as a driver stage, so that it is able to be actuated directly via a logic signal, in a space-saving and cost-saving manner.

In particular, the circuit configuration may provide a targeted effect on a steeply dropping signal edge at the low-side outputs, without smoothing away a rising signal edge. Furthermore, the circuit configuration, according to the present invention, may provide a small voltage drop in the switched-on state of the switching element, at the latter.

The circuit configuration of the present invention may generally be used together with a switching element, implemented, for instance, as an open collector output, an open drain output or a relay. In particular, it may provide a current intensity and/or an edge slope limitation for both slowly changing and for clocked signals.

It may be particularly advantageous to limit the current intensity and/or the edge slope of the output voltage of the voltage source. Based on the possibly large amplitudes that go along with this, a limiting unit acting on the voltage source may be particularly suitable for maintaining required EMC boundary values.

Moreover, between limiting element and voltage source, there may be situated a capacitive element and/or a diode element, which is positioned parallel to the switching element, the limiting element and the voltage source.

The edge slope may further be able to be set in an improved manner by such an element, and it may simultaneously be used as a protective circuit or a protective element for the limiting element.

DETAILED DESCRIPTION OF THE INVENTION

Figure 1:
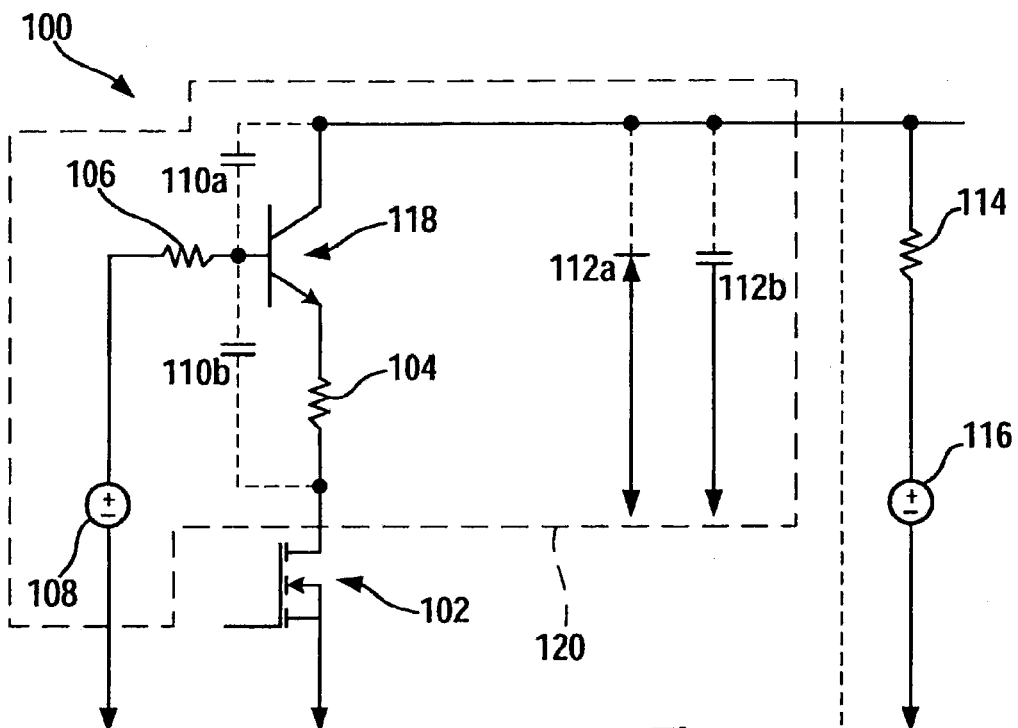
FIG. 1 shows a first exemplary specific embodiment of a circuit configuration for limiting current intensity and/or the edge slope of electrical signals, according to the present invention.

FIG. 1 shows a first exemplary specific embodiment of a circuit configuration for limiting current intensity and/or the edge slope of electrical signals, according to the present invention.

Circuit configuration 100, in this instance, is made, as an example, of an npn transistor 118, whose base is connected to a fixed potential 108. The connection may take place, for instance, via resistor 106 or via a voltage divider. The emitter of element 118 is connected to switching element 102 via a component 104 having a resistor. Switching element 102 is that element which, viewed overall with element 114 having a resistor and voltage source 116, is to be broadened by the current limitation and/or the edge slope limitation while using limitation unit 120.

Optionally, at the base of limiting element 118 of limiting unit 120 circuit configuration 100 may have provided to it a capacitive element 110a,b. In this instance, capacitive element 110a may be connected between the base and the collector of transistor element 118, and capacitive element 110b between the base and the emitter. The collector connection of transistor element 118 may represent the output of the circuit configuration, connected in FIG. 1 in exemplary fashion via an element 114 having a resistor to voltage source 116.

Furthermore, capacitive elements 112a,b may be present and situated at the circuit output. Capacitive element 112b may, for instance, be developed as a capacitor, and capacitive element 112a as an ESD diode. In the case in which an ESD diode is provided, it may, as a function of the embodiment of circuit configuration 100, be equipped, at the same time, to protect the base emitter diode of transistor element 118, for instance, in the case of an npn transistor 118, from a breakdown in a case of polarity reversal.

The electrical resistance of element 114 may advantageously be clearly greater than that of the electrical resistor of element 104. Thereby, in the case of switched-on switching element 102, there comes about only a slight voltage at the circuit output. A ratio of 10:1 or greater than 10:1 is preferred. Consequently, in the case of the switched-on switching element, there comes about at the output a dropping voltage, without taking into account a low voltage drop over elements 118 and 102, of less than 10% of the value of voltage source 116.

As switching element 102, one may use, for instance, a transistor element, a relay element or a switching contact.

The method of functioning of the edge slope limitation of the circuit configuration according to FIG. 1 is as follows: Without limitation unit 120 which, in the final analysis, includes each element except switching element 102, resistor element 114 as well as voltage source 116, as a function of its respective embodiment and the possibly optional elements thus provided, there may come about, when switching element 102 is switched on, a steeply dropping voltage edge at the output of circuit configuration 100, since this is relatively at low resistance, drawn directly via switching element 102 to low potential. The edge that is created in response to switching off switching element 102, runs clearly flatter, because of the electrical resistor of resistance element 114 in connection with the capacitance present at the output. The output capacitance may be present in this case either as a component having a capacitance or only as a parasitic capacitance.

The aim of a limitation of the edge slope may thus be, in particular, especially to flatten off the falling edge of the output signal, but without smoothing away the rising edge too greatly, in the process, so that, in particular, the signal integrity may remain ensured.

The switching on of switching element 102 effects a drop in the emitter potential of limiting element 118, so that limiting element 118 also switches on. Parasitic capacitances and perhaps present capacitive components 112a,b now discharge resistor element 104 and switching element 102 via limiting element 118. This creates a voltage drop at resistor element 104 as well as switching element 102. This voltage drop, in turn, leads to a reduction in the available base emitter voltage of limiting element 118, and thus to a current feedback. From this, there results a pinch-off of limiting elements 118, and thus a limitation of the discharge current. The falling edge at the output runs flatter through this limitation.

When switching element 102 is switched off, parasitic capacitances and optionally present capacitive components 112a,b are charged comparatively slowly via resistance element 114. Such a charging current does not limit limiting unit 120, however, so that the edge, which is anyhow already rising flatly at the output, is not additionally smoothed away.

In response to the use of an optional capacitive component 110a,b, if necessary, the falling edge may additionally be smoothed away.

Element 110a may particularly represent an artificial increase in a Miller capacitance of limiting element 118, whereby it switches more slowly. In response to the switching on of switching element 102, limiting element 118 also begins to conduct, whereby the potential at its collector begins to drop off. Because of a capacitive coupling of the collector to the base, by capacitive element 110a, this in turn acts counter to the progression of element 118, so that the switching on of limiting element 118 slows down. The switching-on process is concluded only after capacitive element 110a is completely recharged.

However, the additional capacitance may also be recharged during switching off switching element 102. The rising edge at the output may, thereby, in spite of it, be influenced only slightly since, in practice, relatively low capacitance values may already be sufficient for capacitive element 110a.

The preferred, but not exclusive values or value ranges of the individual elements may be assumed to be as shown below:

voltage source 116: 1 V to 50 V;
element 112b: 10 pF to 100 nF;
element 112a: Zenner voltage <60 V;
element 118, 102: to be selected corresponding to requested limiting current, typically 0.1 mA to 100 mA, at power outputs also >1 A;
Element 104 is preferably selected so that, in the case of a limiting current, a voltage drop is present that is sufficient for the current feedback (approximately in the range of 0.5 V to 3 V).
Element 114: by a factor of 10>element 104, so that in response to the switching of element 102, a meaningful voltage difference occurs at the output;
Element 108: Minimum value ca. 2× base-emitter voltage of element 118, thus for a bipolar transistor at least ca. 1.2 V. Maximum value clearly smaller than element 116, so that a limitation of the falling edge or the current in the short circuit case comes about. For example, the voltage of element 108 is approximately in the range of 1:5 to 1:20 smaller than the voltage of element 116;
Element 106 is used for limiting the base current of element 118. One would typically select the base current to be ca. 10× to 200×<than the limiting current of the circuit. The factor (10 to 200) depends on the current amplification of the selected transistor;
Elements 110a, 110b: 10 pF to 22 nF. If the smoothing away of the rising edge is to be avoided, a value in the lower range will be used for element 110a, as a general tendency, that is, generally a smaller value than for element 112b.

Optional capacitive element 110b may also be used to slow down the switching-on process of limiting element 118. As soon as switching element 102 switches on, thus being in the conductive state, the base of element 118 is drawn capacitively to ground, so that element 118 is blocking for now. Only by recharging element 110b via resistor element 106 does limiting element 118 begin to conduct.

The method of functioning of a current limitation of the circuit configuration according to FIG. 1 is as follows: When element 102 is switched on, the current in the output line leads to a voltage drop at resistor element 104. In regular operation, this voltage drop is so small, however, that the base-emitter voltage at limiting element 118 is sufficient to power up element 118 itself, for example, during use of a transistor, advantageously, however, not necessarily to saturation.

If the output line is now, at low resistance, connected to positive potential, for example, in a short circuit case, the current rises in the output line only to the extent until the voltage drop at element 104 having a resistor and switching element 102 is so great that the base-emitter voltage of limiting element 118 is no longer sufficient for fully powering up the transistor. The voltage drop over the collector-emitter path of limiting element 118 thus rises, and the current in the output line is limited. In this operating case, a sufficient power dissipation may be necessary, consequently a cooling of limiting element 118.

The output voltage of voltage source 116 may particularly be accepted as the voltage of the series circuit of voltage source 116 and of resistor element 114.

Figure 2:
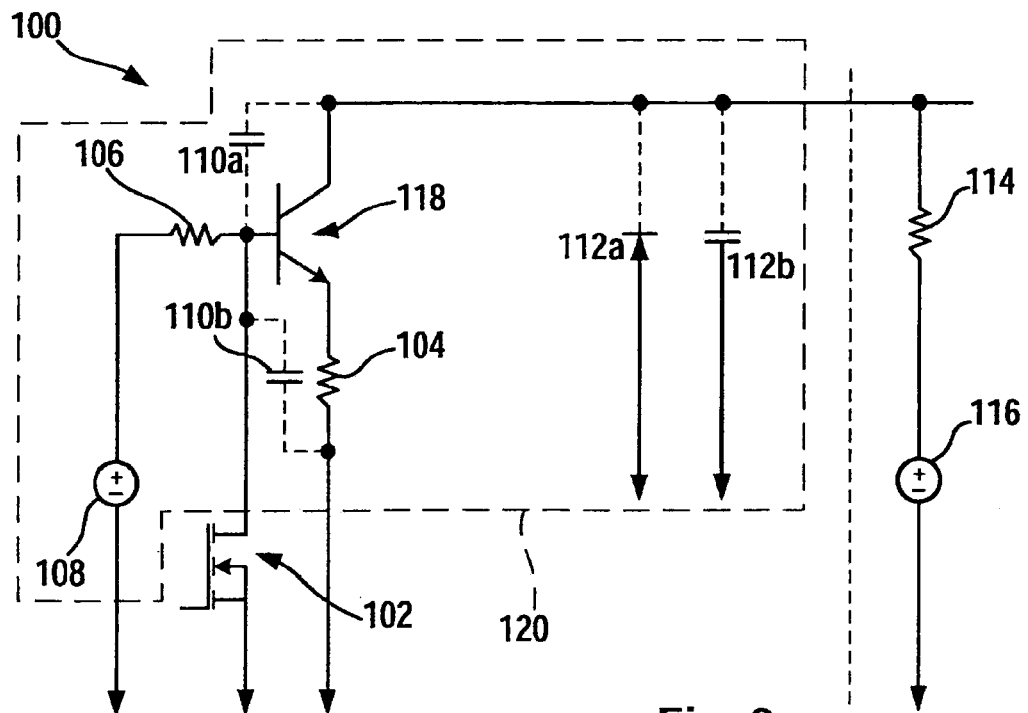
FIG. 2 shows a further exemplary embodiment of a circuit configuration for limiting current intensity and/or the edge slope of electrical signals, according to the present invention.

With further reference to FIG. 2, an additional exemplary embodiment is shown of a circuit configuration for limiting current intensity and/or edge slope of electrical signals, according to the present invention.

Alternatively to a series circuit of limiting unit and switching element 102, as shown in FIG. 1, a parallel circuit of limiting element 118 and switching element 102 may also be implemented. In this instance, switching element 102 controls limiting element 118 at its base, and the output signal is thereby inverted.

The current amplification of limiting element 118 may optionally be used so that for switching element 102 a switching element may be used that has lower power. In this case, direct activation of limiting element 118 from an open drain output of a microcontroller may be possible. Thereby a special amplifier stage may be saved.

The method of functioning of the circuit configuration according to FIG. 2 is analogous to the circuit configuration according to FIG. 1.

If a MOSFET is used as contact element 102, its parasitic body diode may protect the base-emitter diode of limitation element 118 from a breakdown in response to polarity reversal of the circuit. In this case, however, the body diode has to have a sufficiently high current carrying capacity.

Figure 3:
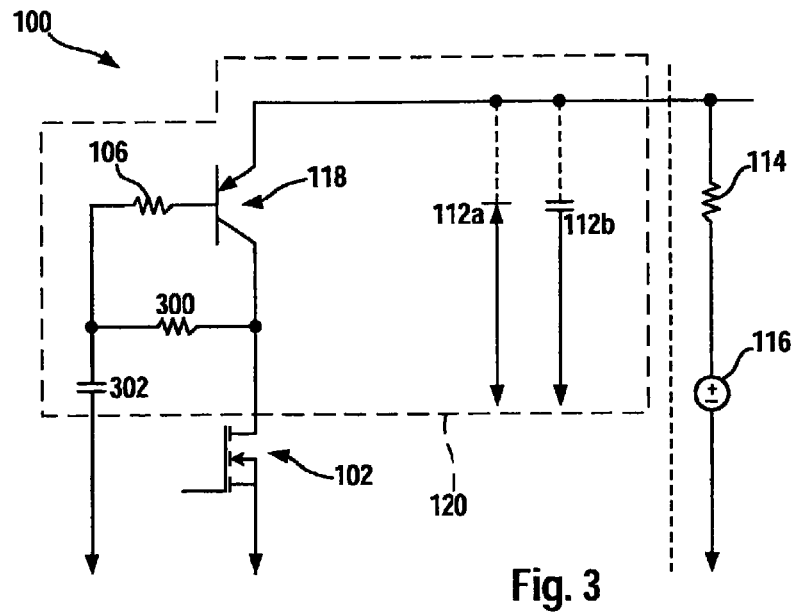
FIG. 3 shows a further exemplary embodiment of a circuit configuration for limiting an edge slope of electrical signals, according to the present invention.

With further reference to FIG. 3, an exemplary embodiment is shown of a circuit configuration for limiting the edge slope of electrical signals, according to the present invention.

The circuit configuration according to FIG. 3 may particularly be considered as a pure edge limitation. When switching element 102 is switched off, capacitive element 302 is charged to the potential of voltage source 116 via resistor element 106, limitation element 118 and resistor element 114. Now, when switching element 102 switches on, limitation element 118 is blocked. Capacitive element 302 now discharges via resistor element 300 and switching element 102, so that the base potential of limitation element 118 drops off slowly. The latter begins to conduct, and the output voltage level follows the curve of the base voltage of limitation element 118. As soon as switching element 102 switches off again, capacitive element 302 is charged via resistor element 106, limitation element 118 and resistor element 114, whereby the output potential rises to the value of voltage source 116 again. If an element 112a,b is present, the capacitance of capacitive element 302 may be selected to be small compared to the capacitance of element 112a,b, whereby the rising edge of the circuit configuration is only slightly influenced.

At the moment of switching on element 102, at the circuit output, particularly the behavior of a controlled edge may be implemented.

For the circuit configurations of FIGS. 1 and 2, a variable current limitation may continue to be implementable. To do this, limitation element 118 should be connected at the base side to a variable potential. The quantity of this potential may be able to be set by the current limitation.

The bipolar transistor for limitation element 118, shown in exemplary fashion, may be executed in all circuit configurations of FIGS. 1 to 3, alternatively also by other transistor types, such as a MOSFET or a JFET, as operational amplifier or tube element. The connections should then be selected correspondingly to the component used.

In the event that in the circuit configurations of FIGS. 1 to 2 a self-conducting n-channel FET is selected for limitation element 118, its gate connection to ground potential may also take place, for example, so that no auxiliary voltage may be required.

If switching element 102 is missing in the circuit configuration according to FIG. 2 or is replaced by a short circuit in the circuit configuration according to variant 1, a pure current limitation circuit configuration comes about in the respective circuit configurations.

All circuit configurations, in deviation from those implementations shown in the figures, also to be understood schematically, may also be used wholly or partially in integrated form.

Figure 4:
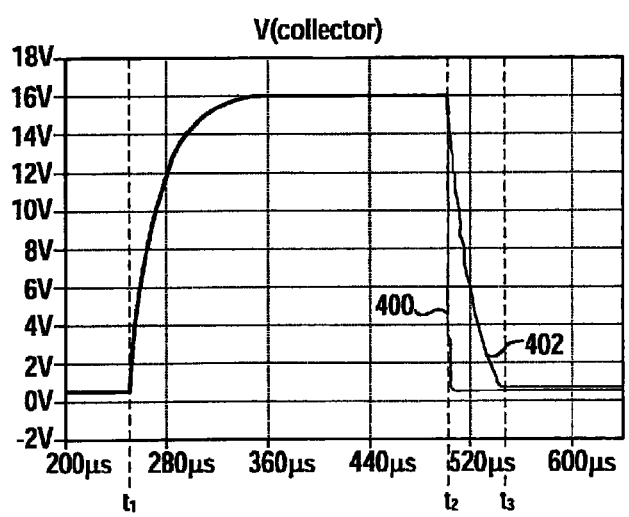
FIG. 4 shows an exemplary signal curve of the circuit configuration according to FIG. 1.

FIG. 4 shows an exemplary signal curve of the circuit configuration according to FIG. 1.

At time $t_1$, in the circuit configuration according to FIG. 1, switching element 102 is switched off. Output voltage V (collector) thereby rises to the exemplary value of 16 V. At time $t_2$, switching element 102 switches on. In case exclusively one switching element 102 and elements 114 and 116 are provided, switching takes place having a slope of edge 400, essentially directly, in exemplary fashion. In the case of situating limiting unit 120, falling edge 402 is limited in its slope, whereby it falls at a slower rate and is only established at point $t_3$ in its lower value, which is essentially determined by the ratio of the electrical resistances of resistor elements 114 and 104.

Figure 5:
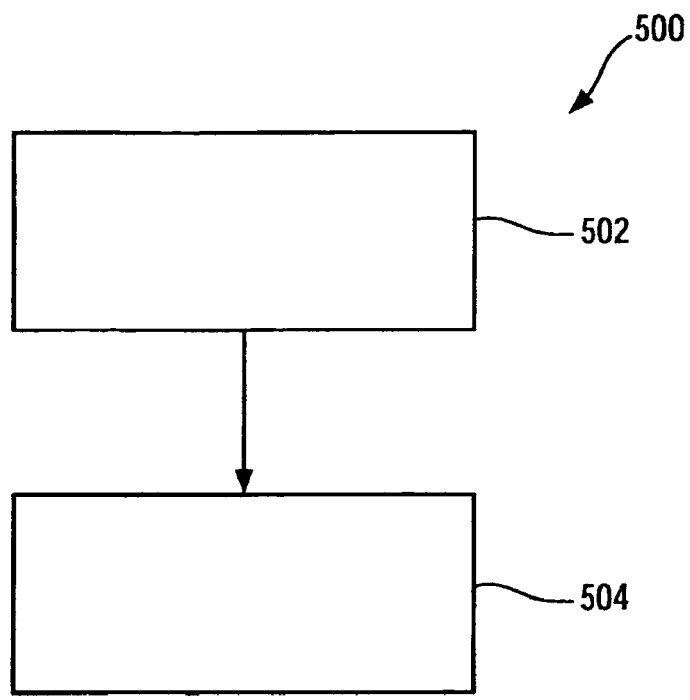
FIG. 5 shows an exemplary specific embodiment of a method for limiting current intensity and/or the edge slope of electrical signals, according to the present invention.

FIG. 5 shows an exemplary specific embodiment of a method for limiting current intensity and/or edge slope of electrical signals, according to the present invention.

Method 500 for limiting current intensity and/or edge slope of electrical signals has the steps carrying out 502 of a switching process of the voltage source while using the switching element and limiting 504 a current intensity and/or an edge slope of an electrical signal, particularly of the output voltage, while using a limiting unit.

What is claimed is:

1. A circuit configuration for limiting at least one of a current intensity and an edge slope of an electrical signal, comprising:
   a switching element configured to be selectively connected to a voltage source and selectively switch the voltage source;
   a limiting unit situated functionally between the switching element and the voltage source, the limiting unit being configured to limit the at least one of a current intensity and an edge slope of an electrical signal during a switching process of the voltage source while using the switching element;

a first resistor element at the emitter terminal of the limiting unit; and a second resistor element between the limiting unit and the voltage source, wherein the second resistor element has at least ten times the resistance of the first resistor element;

wherein the limiting unit includes a limiting element with at least one capacitor situated between the base terminal and the collector terminal of the limiting element, and at least one capacitor situated between the base terminal and the emitter terminal of the limiting element.

2. The circuit configuration as recited in claim 1, further comprising:

the voltage source, wherein the electrical signal is an output voltage of the voltage source, and the switching of the voltage source includes at least one of switching on and switching off of the voltage source.

3. The circuit configuration as recited in claim 2, wherein the limiting unit has a limiting element situated in series between the voltage source and the switching element.

4. The circuit configuration as recited in claim 2, wherein the limiting unit has a limiting element situated in parallel to the voltage source and the switching element.

5. The circuit configuration as recited in claim 3, wherein the limiting unit further includes at least one first capacitive element which includes at least one of a capacitor, a diode and an ESD diode, and wherein the first capacitive element is situated in parallel to the voltage source.

6. The circuit configuration as recited in claim 3, wherein at least one of the following is satisfied:
   (i) the limiting element is an element selected from the group consisting of a transistor element, transistor, bipolar transistor, field effect transistor, MOSFET, JFET, operational amplifier, and tube element; and
   (ii) the switching element is an element selected from the group consisting of a transistor element, transistor, bipolar transistor, field effect transistor, MOSFET, JFET, operational amplifier, tube element, relay element and switching contact.

7. The circuit configuration as recited in claim 3, wherein at least one of the following is satisfied:
   (i) the edge slope limitation is implemented by using one of a current feedback in the limiting unit or a controlled edge; and
   (ii) the current intensity limitation is implemented by using a current feedback in the limiting unit.

8. The circuit configuration as recited in claim 3, wherein a third resistor element is situated at the base terminal of the limiting element, a further voltage source is situated at the third resistor element, and a fourth resistor element is situated at the collector terminal of the limiting element.

9. A method for limiting at least one of a current intensity and an edge slope of an electrical signal using a limiting unit functionally situated between a switching element and a voltage source, the method comprising:

performing the switching process of the voltage source by using the switching element, wherein the limiting unit is configured to limit the at least one of a current intensity and an edge slope of an electrical signal during a switching process of the voltage source, and wherein the limiting unit includes a limiting element with at least one capacitor situated between the base terminal and the collector terminal of the limiting element, and at least one capacitor situated between the base terminal and the emitter terminal of the limiting element, and a first resistor element at the emitter terminal of the limiting unit, and a second resistor element between the limiting unit and the voltage source, wherein the second resistor element has at least ten times the resistance of the first resistor element; and limiting, by using the limiting unit, at least one of a current intensity and an edge slope of an output voltage of the voltage source, wherein at least one of (i) the limiting of the edge slope is implemented by using one of a current feedback or a controlled edge, and (ii) the current intensity limitation is implemented by a current feedback.

10. The method as recited in claim 9, wherein the electrical signal is an output voltage of the voltage source, and the switching of the voltage source includes at least one of switching on and switching off of the voltage source.

11. The method as recited in claim 10, wherein the limiting is performed via a limiting unit having a limiting element in series between the voltage source and the switching element.

12. The method as recited in claim 10, wherein the limiting is performed via a limiting unit having a limiting element in parallel to the voltage source and the switching element.

13. The method as recited in claim 11, wherein the limiting unit further includes at least one first capacitive element which includes at least one of a capacitor, a diode and an ESD diode, and wherein the first capacitive element is in parallel to the voltage source.

14. The method as recited in claim 11, wherein at least one of the following is satisfied:
   (i) the limiting element includes one of a transistor element, a transistor, a bipolar transistor, a field effect transistor, a MOSFET, a JFET, an operational amplifier, and a tube element; and
   (ii) the switching element includes one of a transistor element, a transistor, a bipolar transistor, a field effect transistor, a MOSFET, a JFET, an operational amplifier, a tube element, a relay element and switching contact.

15. The method as recited in claim 11, wherein at least one of the following is satisfied:
   (i) the edge slope limitation is implemented by using one of a current feedback in the limiting unit or a controlled edge; and
   (ii) the current intensity limitation is implemented by using a current feedback in the limiting unit.

16. The method as recited in claim 11, wherein a third element is situated at the base terminal of the limiting element, a further voltage source is situated at the third resistor element, and a fourth resistor element is situated at the collector terminal of the limiting element.

* * * * *